(12) United States Patent
Lin et al.

(10) Patent No.: US 10,636,715 B2
(45) Date of Patent: Apr. 28, 2020

(54) SEMICONDUCTOR PACKAGE AND METHOD OF FABRICATING THE SAME

(71) Applicant: Taiwan Semiconductor Manufacturing Co., Ltd., Hsinchu (TW)

(72) Inventors: Chun-Cheng Lin, New Taipei (TW); Ching-Hua Hsieh, Hsinchu (TW); Chen-Hua Yu, Hsinchu (TW); Chung-Shi Liu, Hsinchu (TW); Chih-Wei Lin, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/874,890

(22) Filed: Jan. 19, 2018

(65) Prior Publication Data

US 2019/0139845 A1     May 9, 2019

Related U.S. Application Data

(60) Provisional application No. 62/582,301, filed on Nov. 6, 2017.

(51) Int. Cl.
*H01L 23/31*     (2006.01)
*H01L 23/498*    (2006.01)
(Continued)

(52) U.S. Cl.
CPC ........ *H01L 23/3114* (2013.01); *H01L 21/486* (2013.01); *H01L 21/4853* (2013.01); *H01L 21/565* (2013.01); *H01L 21/566* (2013.01); *H01L 23/295* (2013.01); *H01L 23/3121* (2013.01); *H01L 23/3135* (2013.01); *H01L 23/3675* (2013.01); *H01L 23/49816* (2013.01); *H01L 23/5384* (2013.01); *H01L 23/5385* (2013.01); *H01L 23/5386* (2013.01); *H01L 24/16* (2013.01); *H01L 24/32* (2013.01);
(Continued)

(58) Field of Classification Search
CPC . H01L 25/50; H01L 23/481; H01L 21/76898; H01L 21/568; H01L 24/19; H01L 23/5389; H01L 25/105
See application file for complete search history.

(56) References Cited

U.S. PATENT DOCUMENTS 8,802,504 B1   8/2014 Hou et al.
8,803,292 B2   8/2014 Chen et al.
(Continued)

*Primary Examiner* — Thanh Y. Tran
(74) *Attorney, Agent, or Firm* — JCIPRNET

(57) ABSTRACT

A semiconductor package including a circuit substrate, an interposer structure, a plurality of dies, and an insulating encapsulant is provided. The interposer structure is disposed on the circuit substrate. The plurality of dies is disposed on the interposer structure, wherein the plurality of dies is electrically connected to the circuit substrate through the interposer structure. The insulating encapsulant is disposed on the circuit substrate, wherein the insulating encapsulant surrounds the plurality of dies and the interposer structure and encapsulates at least the interposer structure, the insulating encapsulant has a groove that surrounds the interposer structure and the plurality of dies, and the interposer structure and the plurality of dies are confined to be located within the groove.

20 Claims, 8 Drawing Sheets

(51) Int. Cl.
    *H01L 23/538*    (2006.01)
    *H01L 23/367*    (2006.01)
    *H01L 23/29*     (2006.01)
    *H01L 21/48*     (2006.01)
    *H01L 21/56*     (2006.01)
    *H01L 23/00*     (2006.01)
    *H01L 25/065*    (2006.01)
    *B29C 45/14*     (2006.01)
    *B29K 63/00*     (2006.01)
    *B29L 31/34*     (2006.01)

(52) U.S. Cl.
    CPC .............. *H01L 24/33* (2013.01); *H01L 24/73* (2013.01); *H01L 24/81* (2013.01); *H01L 24/95* (2013.01); *H01L 25/0655* (2013.01); *B29C 45/14655* (2013.01); *B29K 2063/00* (2013.01); *B29K 2995/0007* (2013.01); *B29L 2031/3406* (2013.01); *H01L 24/13* (2013.01); *H01L 2224/1312* (2013.01); *H01L 2224/13109* (2013.01); *H01L 2224/13111* (2013.01); *H01L 2224/13113* (2013.01); *H01L 2224/13118* (2013.01); *H01L 2224/13139* (2013.01); *H01L 2224/13144* (2013.01); *H01L 2224/13147* (2013.01); *H01L 2224/13149* (2013.01); *H01L 2224/13155* (2013.01); *H01L 2224/16225* (2013.01); *H01L 2224/33181* (2013.01); *H01L 2224/73204* (2013.01); *H01L 2224/73253* (2013.01); *H01L 2224/81192* (2013.01); *H01L 2924/1431* (2013.01); *H01L 2924/15311* (2013.01); *H01L 2924/181* (2013.01); *H01L 2924/18161* (2013.01); *H01L 2924/19101* (2013.01); *H01L 2924/3511* (2013.01)

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2012/0211885 A1* | 8/2012 | Choi .................. H01L 23/3128 257/737 |

* cited by examiner

SEMICONDUCTOR PACKAGE AND METHOD OF FABRICATING THE SAME

CROSS-REFERENCE TO RELATED APPLICATION

This application claims the priority benefit of U.S. provisional application Ser. No. 62/582,301, filed on Nov. 6, 2017. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many semiconductor integrated circuits are typically manufactured on a single semiconductor wafer. Dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
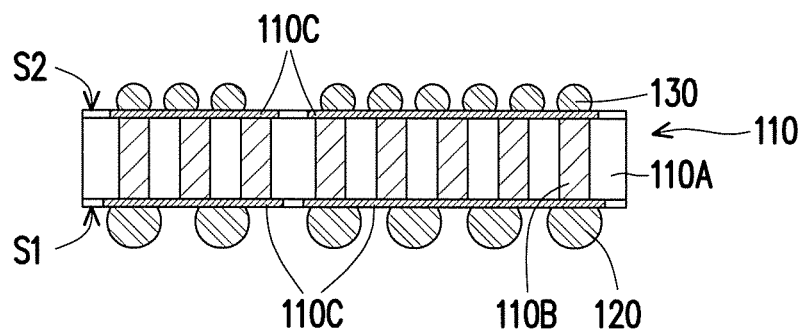
FIG. 1 to FIG. 5B are schematic views of various stages in a method of fabricating a semiconductor package according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 5B are schematic views of various stages in a method of fabricating a semiconductor package according to some exemplary embodiments of the present disclosure. Referring to FIG. 1, an interposer structure 110 is provided. In some embodiments, the interposer structure 110 comprises an interposer substrate 110A, a plurality of conductive pillars 110B and a plurality of metallic patterns 110C. In some embodiments, the interposer substrate 110A may be a silicon substrate or other type of suitable substrates. In some embodiments, the plurality of conductive pillars 110B is for example, through substrate vias (TSV) or other through vias. In certain embodiments, the plurality of conductive pillars 110B penetrates through the interposer substrate 110A from one side of the interposer substrate 110A to another side of the interposer substrate 110A. The conductive pillars 110B may for example, be made of conductive materials such as copper (Cu), titanium (Ti), tantalum (Ta) or other suitable metallic materials. In some embodiments, the plurality of conductive pillars 110B is formed by spin coating of a photoresist material layer, baking of the photoresist material layer, photolithography (i.e. exposure and development processes), plating (e.g., electro-plating or electro-less plating), and photoresist stripping processes. In certain embodiments, the plurality of metallic patterns 110C are formed on two sides of the interposer substrate 110A. In some embodiments, the metallic patterns 110C formed on one side of the interposer substrate 110A may be electrically connected to the metallic patterns 110C formed on an opposing side of the interposer substrate 110A through the plurality of conductive pillars 110B. That is, the plurality of conductive pillars 110B provide an electrical connection therebetween. The metallic patterns 110C may be formed using the same conductive materials as the plurality of conductive pillars 110B, but not limited thereto. In some other embodiments, any suitable metallic materials may be used to form the metallic patterns 110C.

As shown in FIG. 1, in the exemplary embodiment, the interposer structure 110 has a first surface S1, and a second surface S2 opposite to the first surface S1. In some embodiments, the metallic patterns 110C are exposed on the first surface S1 and the second surface S2 of the interposer structure 110 to provide further electrical connection. In certain embodiments, a plurality of first conductive bumps 120 is disposed on the first surface S1 of the interposer structure 110, and a plurality of second conductive bumps 130 is disposed on the second surface S2 of the interposer structure 110. The first conductive bumps 120 are for example, electrically connected to the second conductive bumps 130 through the plurality of conductive pillars 110B and the metallic patterns 110C. A material of the first conductive bumps 120 and the second conductive bumps 130 are for example, tin, silver, copper, nickel, bismuth, zinc, manganese, antimony, indium, cadmium, gold and/or alloys thereof. In some embodiments, the material of the first conductive bumps 120 and the second conductive bumps 130 may be the same or different. In certain embodiments, the first conductive bumps 120 are for example controlled collapse chip connection (C4) bumps, wherein the C4 bumps may have a diameter in the range of approximately 10 μm to 300 μm. Furthermore, in some embodiments, the second conductive bumps 130 are for example micro-bumps (μbumps) that may have a diameter smaller than that of the first conductive bumps 120.

Figure 2:
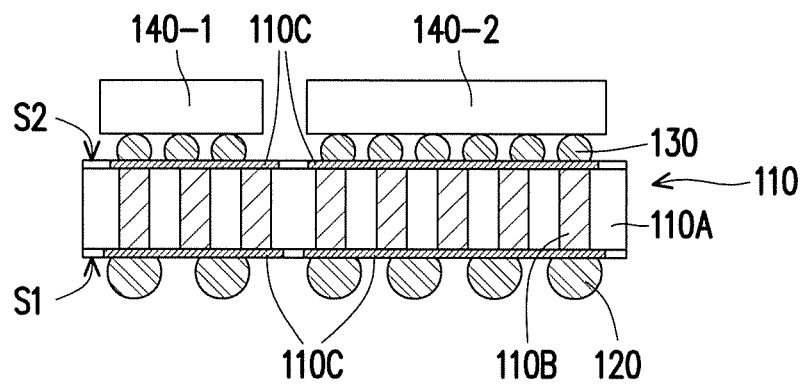

Next, as shown in FIG. 2, a plurality of dies (140-1 and 140-2) is disposed on a second surface S2 of the interposer structure 110. In some embodiments, the plurality of dies (140-1 and 140-2) is electrically connected to the interposer structure 110 through the plurality of second conductive bumps 130. For instance, the plurality of dies may comprise at least a first die 140-1 and a second die 140-2, and each of the first die 140-1 and the second die 140-2 are electrically connected to the metallic patterns 110C and the conductive pillars 110B of the interposer structure 110 through the second conductive bumps 130. In some embodiments, the first die 140-1 and the second die 140-2 may be a memory chip or an application processor chip, but not limited thereto. In some embodiments, the first die 140-1 and the second die 140-2 may be the same type of die. However, in alternative embodiments, the first die 140-1 and the second die 140-2 may be different types of die. Although only two dies (140-1 and 140-2) are illustrated in FIG. 2, however, in some embodiments, the number of dies disposed on the interposer structure 110 may be adjusted based on requirement.

Figure 3:
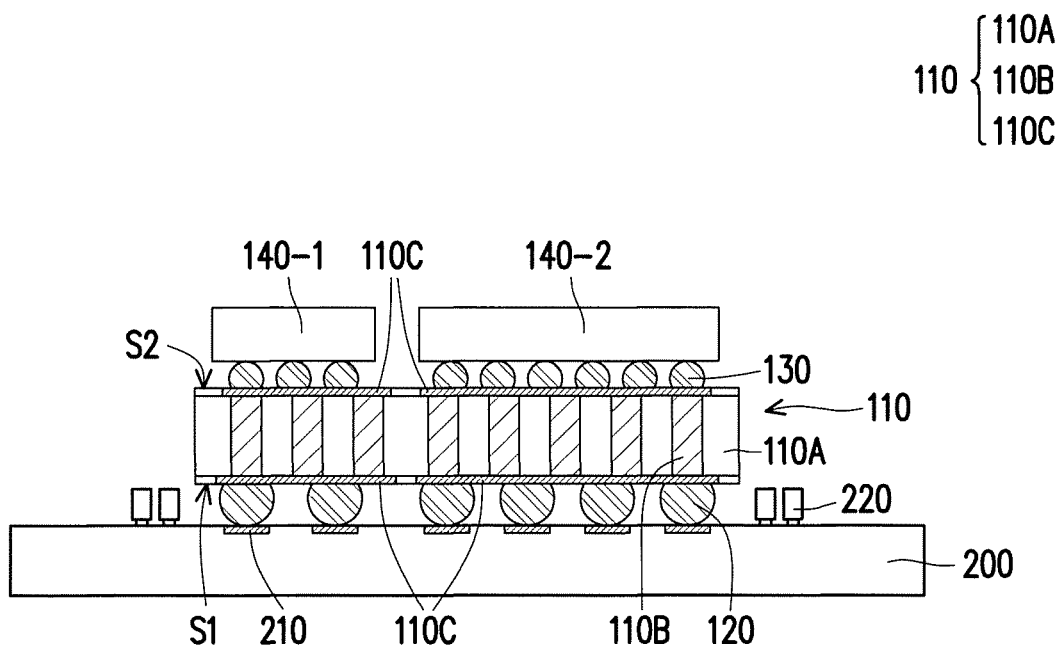

Referring to FIG. 3, after disposing the plurality of dies (140-1 and 140-2) on the interposer structure 110, the interposer structure 110 and the plurality of dies (140-1 and 140-2) are mounted on the circuit substrate 200. The circuit substrate 200 may for example, be a package substrate, a printed circuit board (PCB), or the like. In some embodiments, the interposer structure 110 is electrically connected to the circuit substrate 200 through the plurality of first conductive bumps 120. For instance, in the exemplary embodiment, the circuit substrate 200 may include bond pads 210, whereby the metallic patterns 110C and the conductive pillars 110B of the interposer structure 110 are electrically connected to the bond pads 210 of the circuit substrate 200 through the plurality of first conductive bumps 120. In certain embodiments, the interposer structure 110 electrically connects the underlying circuit substrate 200 to the plurality of dies (140-1 and 140-2). Furthermore, in some embodiments, a plurality of passive components 220 may be disposed on the surface of the circuit substrate 200, and be adjacent to the interposer structure 110 and the plurality of dies (140-1 and 140-2). In certain embodiments, the passive components 220 for example, includes resistors, capacitors, inductors or the like.

Figure 4:
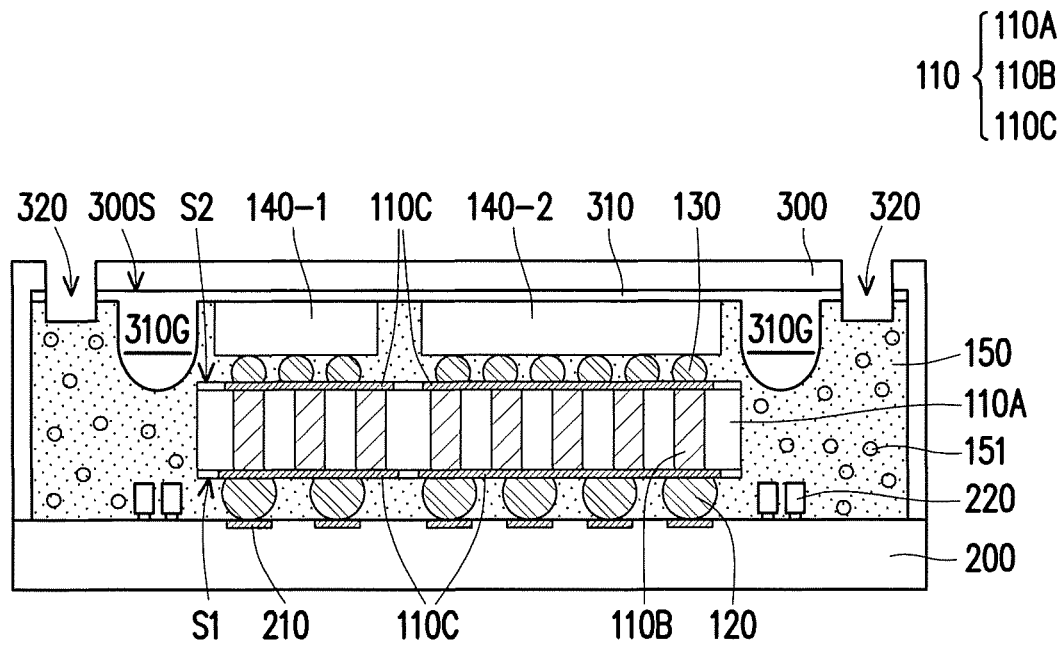

Referring to FIG. 4, after mounting the interposer structure 110 and the plurality of dies (140-1 and 140-2) on the circuit substrate 200, an insulating encapsulant 150 is formed to surround and encapsulate the interposer structure 110, the plurality of dies (140-1 and 140-2) and the passive components 220. In the illustrated embodiment, the insulating encapsulant 150 may be formed by providing a mold 300 on the circuit substrate 200. The mold 300 covers the interposer structure 110, the plurality of dies (140-1 and 140-2) and the passive components 220. In some embodiments, the mold 300 may comprise runner holes 320 and a release film 310 attached to an inner surface 300S of the mold 300. In the illustrated embodiment, the release film 310 may have specific protruding portions 310G. The protruding portions 310G of the release film 310 may correspond to a groove formed in the insulating encapsulant 150 in a subsequent step. In some embodiments, the shapes or dimensions of the protruding portions 310G may be adjusted based on the requirements of the groove. In some alternative embodiments, the protruding portions 310G of the release film 310 may be omitted, and other methods may be used to form the groove.

Referring still to FIG. 4, in some embodiments, the runner holes 320 are located at a periphery near two edges of the mold 300. The runner holes 320 are for example, holes that are used for injecting an insulating material into the mold 300 so that the insulating material encapsulates the interposer structure 110, the plurality of dies (140-1 and 140-2) and the passive components 220. In some embodiments, the insulating material is a molding compound formed by a molding process. In some other embodiments, the insulating material includes epoxy resin or other suitable dielectric materials. In certain embodiments, after injecting the insulating material from the runner holes 320 into the mold 300, the insulating material is cured to form the insulating encapsulant 150. The insulating encapsulant 150 for example, fills up the spaces in between the interposer structure 110, the plurality of dies (140-1 and 140-2), the first conductive bumps 120 and the second conductive bumps 130. Furthermore, the insulating encapsulant 150 fills up the spaces in between each of the passive components 220. In some embodiments, filler particles 151 may be included in the insulating encapsulant 150. The filler particles 151 may be dielectric particles of $SiO_2$, $Al_2O_3$, silica, or the like, and may have spherical shapes. In some embodiments, fine fillers or large fillers may be used as the filler particles 151 based on requirement.

Figure 5A:
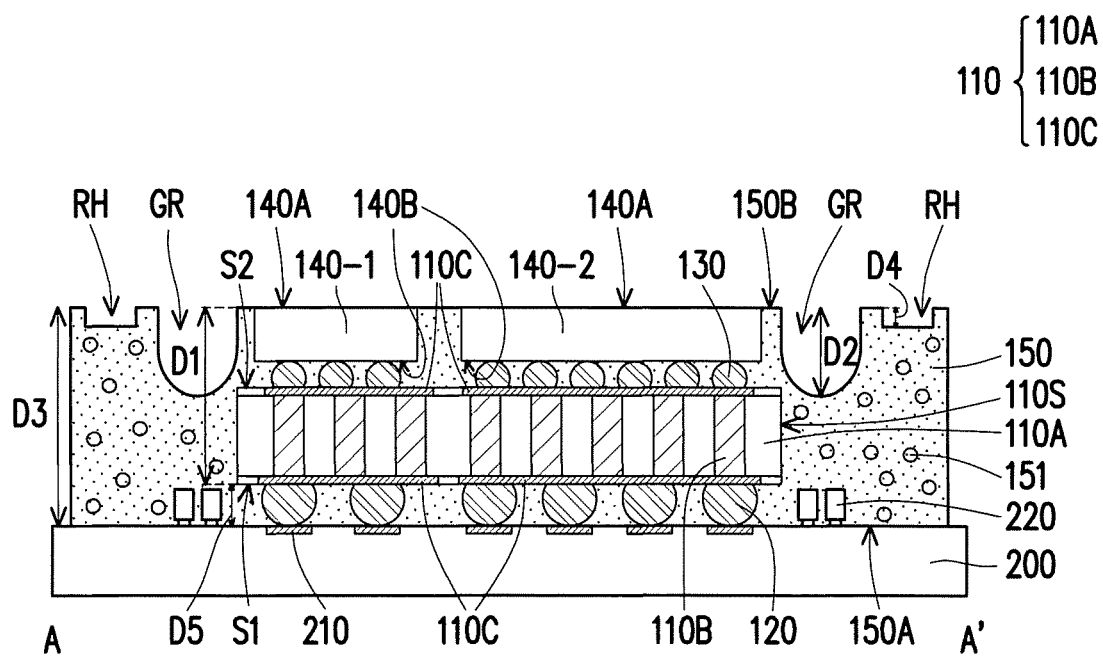
Figure 5B:
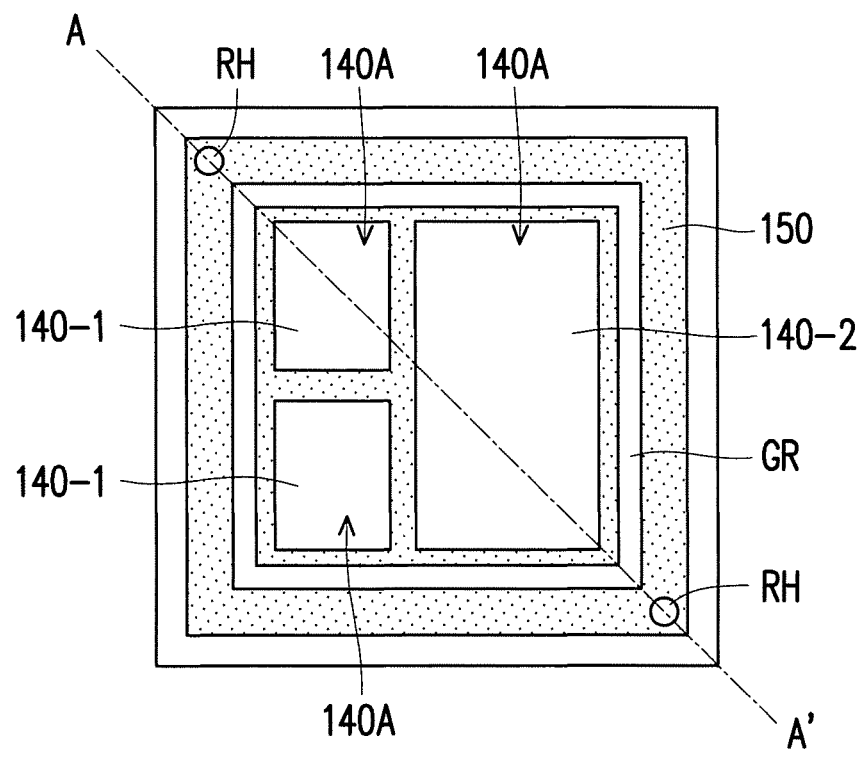

In a subsequent step, after separating the insulating encapsulant 150 from the mold 300, a semiconductor package 100A according to some exemplary embodiments of the disclosure may be formed as shown in FIG. 5A and FIG. 5B. FIG. 5B is a top view of the semiconductor package 100A according to some embodiments, while FIG. 5A is a sectional view taken along line A-A' of FIG. 5B.

Referring to FIG. 5A and FIG. 5B, the semiconductor package 100A comprises a circuit substrate 200, an interposer structure 110, a plurality of first conductive bumps 120, a plurality of dies (140-1 and 140-2), a plurality of second conductive bumps 130 and an insulating encapsulant 150. In the exemplary embodiment, the interposer structure 110 is disposed on the circuit substrate 200. The plurality of first conductive bumps 120 is disposed in between the circuit substrate 200 and the interposer structure 110, wherein the interposer structure 110 is electrically connected to the circuit substrate 200 through the plurality of first conductive bumps 120. In some embodiments, the plurality of dies (140-1 and 140-2) is disposed on the interposer structure 110. The plurality of second conductive bumps 130 is disposed in between the interposer structure 110 and the plurality of dies (140-1 and 140-2), wherein the plurality of dies (140-1 and 140-2) is electrically connected to the interposer structure 110 through the plurality of second conductive bumps 120.

In certain embodiments, the insulating encapsulant 150 is at least encapsulating sidewalls 110S of the interposer structure 110, and encapsulating the plurality of dies (140-1 and 140-2), the first conductive bumps 120, the second conductive bumps 130 and the passive components 220. The plurality of dies (140-1 and 140-2) may each have a first side 140A and a second side 140B. In some embodiments, the second side 140B of the dies (140-1 and 140-2) is facing the interposer structure 110, whereas the first side 140A of the dies (140-1 and 140-2) is facing away from the interposer structure 110. That is, in some embodiments, the second side 140B is considered to be the active surface, whereas the first side 140A is considered to be the back surface of the dies (140-1 and 140-2). As illustrated in FIG. 5A and FIG. 5B, the insulating encapsulant 150 has a first surface 150A contacting the circuit substrate 200 and a second surface 150B opposite to the first surface 150A. In certain embodiments, the first sides 140A (back surfaces) of the plurality of dies (140-1 and 140-2) are exposed through the insulating encapsulant 150 from the second surface 150B. That is, the first sides 140A of the plurality of dies (140-1 and 140-2) may be observed from the top view of the semiconductor package 100A shown in FIG. 5B. In some embodiments, the second surface 150B of the insulating encapsulant 150 is coplanar/levelled with the exposed first sides 140A of the plurality of dies (140-1 and 140-2).

Furthermore, in the exemplary embodiment, the insulating encapsulant 150 has a groove GR that surrounds the interposer structure 110 and the plurality of dies (140-1 and 140-2), and the interposer structure 110 and the plurality of dies (140-1 and 140-2) are confined to be located within the groove GR. In certain embodiments, the groove GR is located on the second surface 150B of the insulating encapsulant 150. As more clearly represented in the top view of the semiconductor package 100A shown in FIG. 5B, two of the first dies 140-1 and the second die 14 are located within an area surrounded by the groove GR, or confined to be located within the groove GR. The groove GR is for example, formed after separating the insulating encapsulant 150 from the mold 300, and the dimensions of the groove GR corresponds to the dimensions of the protruding portions 310G of the release film 310. Although the groove GR of the embodiment is formed by using the release film 310 in the mold 300, however, the disclosure is not limited thereto. In alternative embodiments, no groove is formed after separating the insulating encapsulant 150 from the mold 300, instead, grooves may be formed by laser drilling, cutting or blade saw processes.

As illustrated in FIG. 5A and FIG. 5B, in some embodiments, the insulating encapsulant 150 has two runner hole openings RH located on the second surface 150B of the insulating encapsulant 150. In certain embodiments, a depth D2 of the groove GR is greater than a depth D4 of the runner hole opening RH. In some embodiments, the dimensions of the runner hole openings RH corresponds to the dimensions of the runner holes 320 of the mold 300. Furthermore, the runner hole openings RH may be located adjacent to the grooves GR. In the illustrated embodiment, relative to a sum D1 of a height of one of the plurality of dies (140-1 and 140-2) and a height of the interposer structure 110, the depth D2 of the groove GR is about half of the sum D1. However, the disclosure is not limited thereto. In alternative embodiments, the depth of the groove GR may be adjusted based on requirements. For instance, in certain embodiments, a height of the insulating encapsulant 150 is equal to D3, and the depth D2 of the groove GR is about half of the height D3. In some other embodiments, a depth D2 of the groove GR is more than half of a stand-off height D5 of the interposer structure 110, and less than half of a sum of heights D1 of the plurality of dies (140-1 and 140-2) and the interposer structure 110. In some embodiments, a depth of the groove GR may be approximately in the range of 0.5 mm to 3 mm, whereas a width of the groove GR may be in the range of 1 mm to 5 mm.

Figure 6:
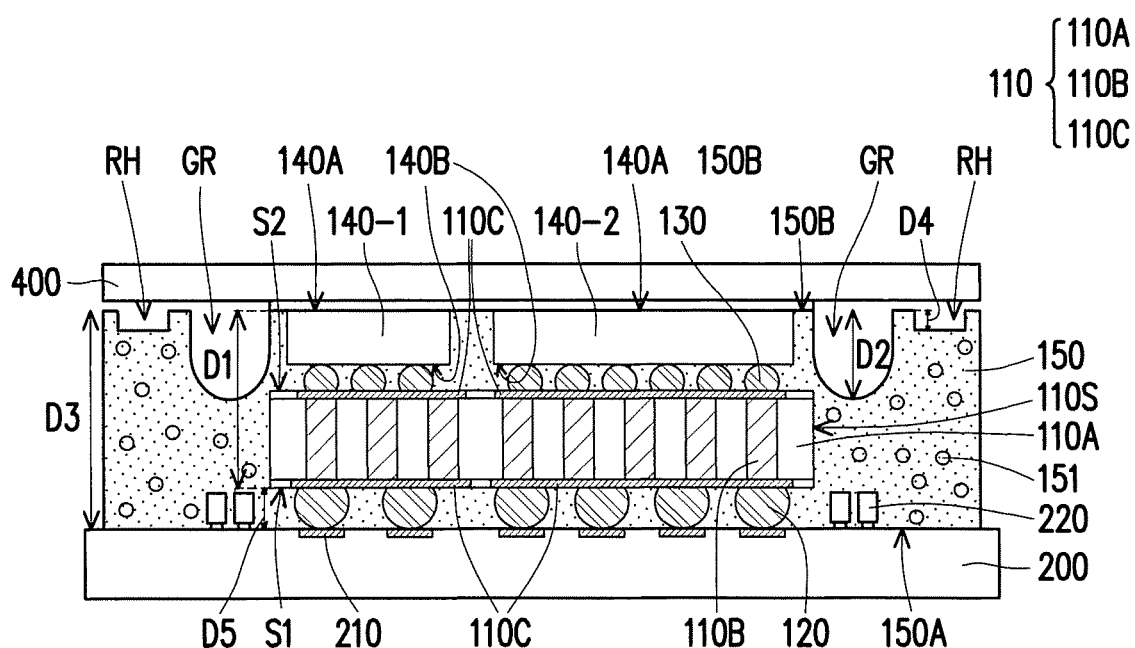
FIG. 6 to FIG. 14 are schematic views of a semiconductor package according to some other exemplary embodiments of the present disclosure.

FIG. 6 is a schematic view of a semiconductor package 100B according to some other exemplary embodiments of the present disclosure. The embodiment shown in FIG. 6 is similar to the embodiments shown in FIG. 5A and FIG. 5B, hence the same reference numerals are used to denote the same and like parts, and its detailed description will be omitted herein. The difference between the embodiment shown in FIG. 6 and the embodiments shown in FIG. 5A and FIG. 5B is that the semiconductor package 100B of FIG. 6 further contains a lid 400. In some embodiments, the lid 400 may be a heat sink used for heat dissipation. In certain embodiments, if thermal dissipation is requested, the lid 400 may be disposed on the circuit substrate 200 to cover the insulating encapsulant 150 and the plurality of dies (140-1 and 140-2). The lid 400 may for example, be disposed on the second surface 150B of the insulating encapsulant 150. In some embodiments, the lid 400 may be disposed on the insulating encapsulant 150 through an attach film (not illustrated).

Figure 7:
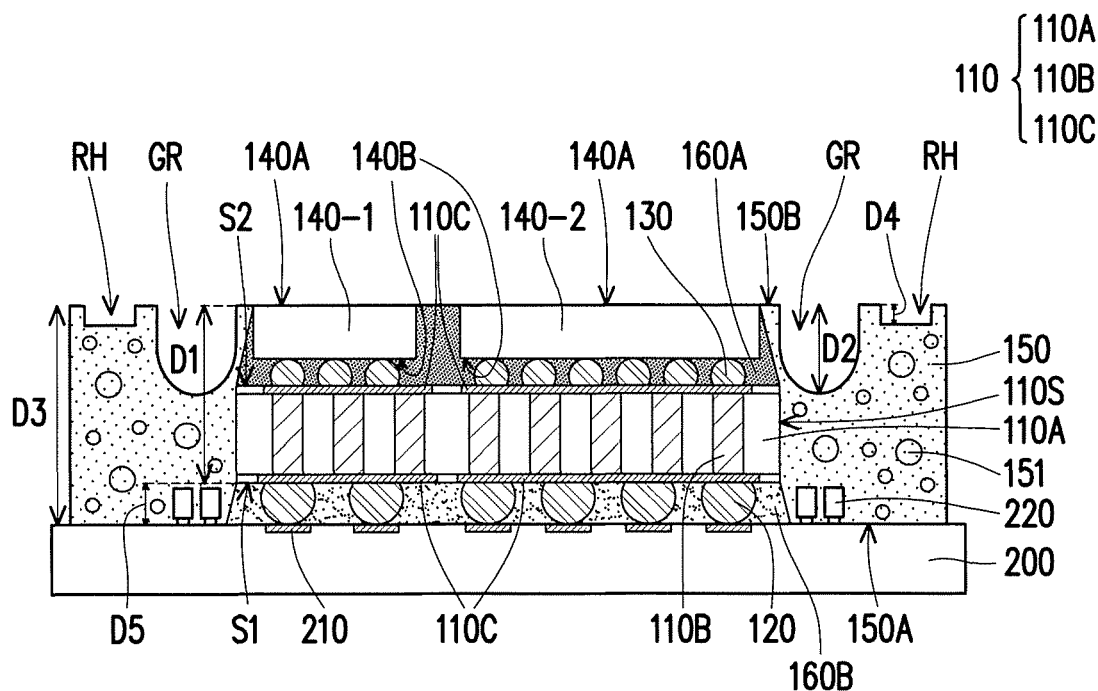

FIG. 7 is a schematic view of a semiconductor package 100C according to some other exemplary embodiments of the present disclosure. The embodiment shown in FIG. 7 is similar to the embodiments shown in FIG. 5A and FIG. 5B, hence the same reference numerals are used to denote the same and like parts, and its detailed description will be omitted herein. The difference between the embodiment shown in FIG. 7 and the embodiments shown in FIG. 5A and FIG. 5B is that the semiconductor package 100C of FIG. 7 further comprises a first underfill 160A and a second underfill 160B. In some embodiments, the first underfill 160A fill the spaces in between the plurality of dies (140-1 and 140-2) and the interposer structure 110, and the second underfill 160B fill the spaces in between the interposer structure 110 and the circuit substrate 200. Furthermore, the first underfill 160A and the second underfill 160B are encapsulated by the insulating encapsulant 150, or embedded within the insulating encapsulant 150. In certain embodiments, larger fillers may be used for the filler particles 151 in the insulating encapsulant 150, whereas fine fillers may be used for the first underfill 160A and the second underfill 160B.

Figure 8:
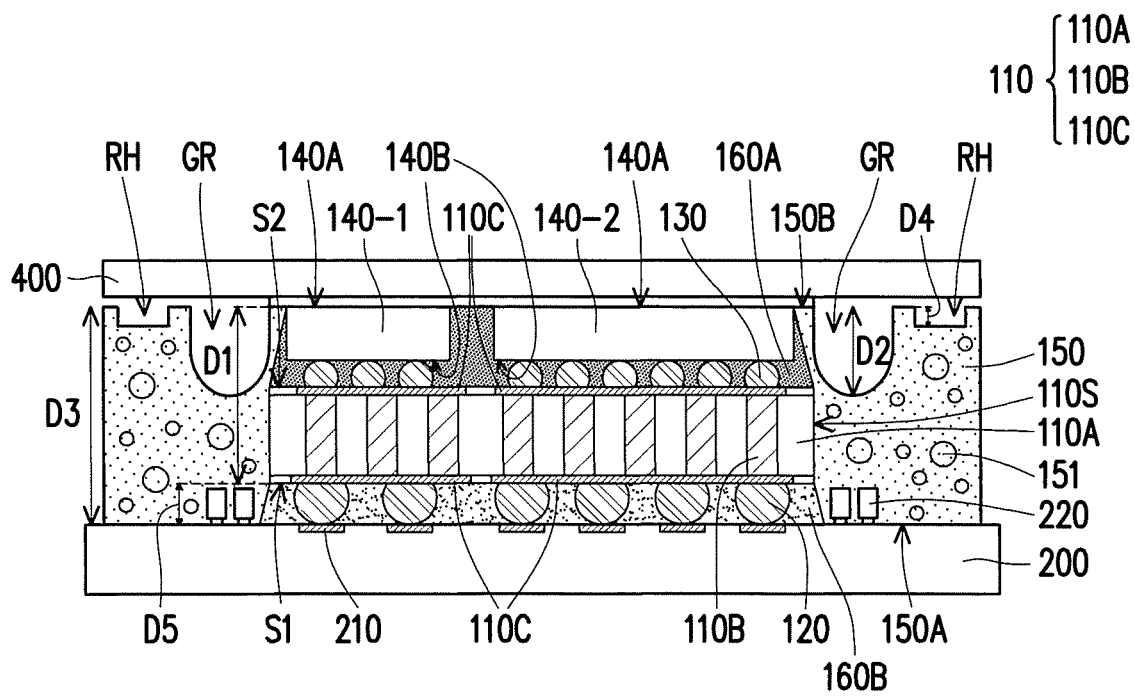

FIG. 8 is a schematic view of a semiconductor package 100D according to some other exemplary embodiments of the present disclosure. The embodiment shown in FIG. 8 is similar to the embodiment shown in FIG. 7, hence the same reference numerals are used to denote the same and like parts, and its detailed description will be omitted herein. The difference between the embodiment shown in FIG. 8 and the embodiment shown in FIG. 7 is that the semiconductor package 100D of FIG. 8 further contains a lid 400. The lid 400 of FIG. 8 is the same as the lid shown in FIG. 6, hence its description will not be repeated. In the exemplary embodiment, the lid 400 may be disposed on the circuit substrate 200 to cover the insulating encapsulant 150, the plurality of dies (140-1 and 140-2), and to cover the first underfill 160A and the second underfill 160B.

Figure 9:
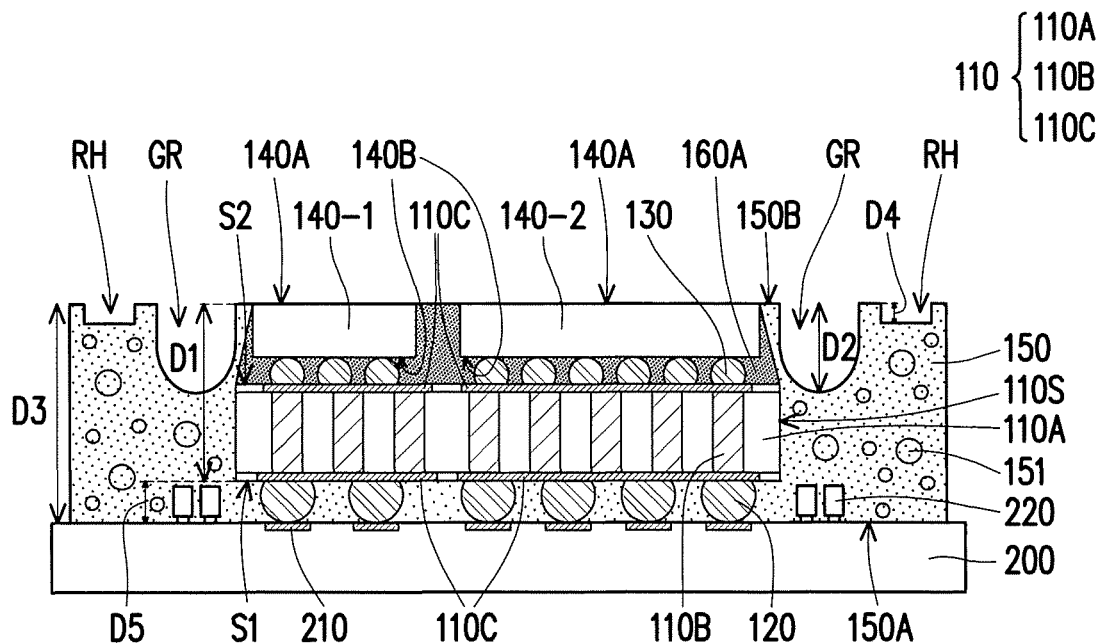

FIG. 9 is a schematic view of a semiconductor package 100E according to some other exemplary embodiments of the present disclosure. The embodiment shown in FIG. 9 is similar to the embodiment shown in FIG. 7, hence the same reference numerals are used to denote the same and like parts, and its detailed description will be omitted herein. The difference between the embodiment shown in FIG. 9 and the embodiment shown in FIG. 7 is that the second underfill 160B is omitted, while the first underfill 160A is retained. In some embodiments, the first underfill 160A and the second underfill 160B are optionally used based on product requirements.

Figure 10:
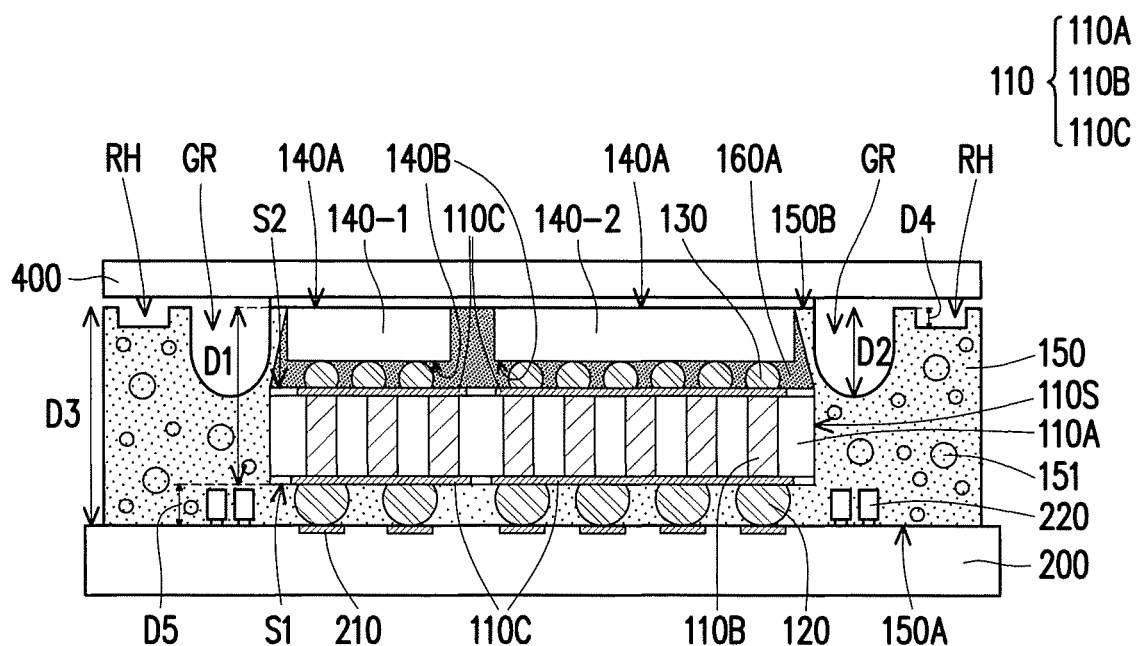

FIG. 10 is a schematic view of a semiconductor package 100F according to some other exemplary embodiments of the present disclosure. The embodiment shown in FIG. 10 is similar to the embodiment shown in FIG. 9, hence the same reference numerals are used to denote the same and like parts, and its detailed description will be omitted herein. The difference between the embodiment shown in FIG. 10 and the embodiment shown in FIG. 9 is that the semiconductor package 100F of FIG. 10 further contains a lid 400. The lid 400 of FIG. 10 is the same as the lid shown in FIG. 6, hence its description will not be repeated. In the exemplary embodiment, the lid 400 may be disposed on the circuit substrate 200 to cover the insulating encapsulant 150, the plurality of dies (140-1 and 140-2), and to cover the first underfill 160A.

Figure 11:
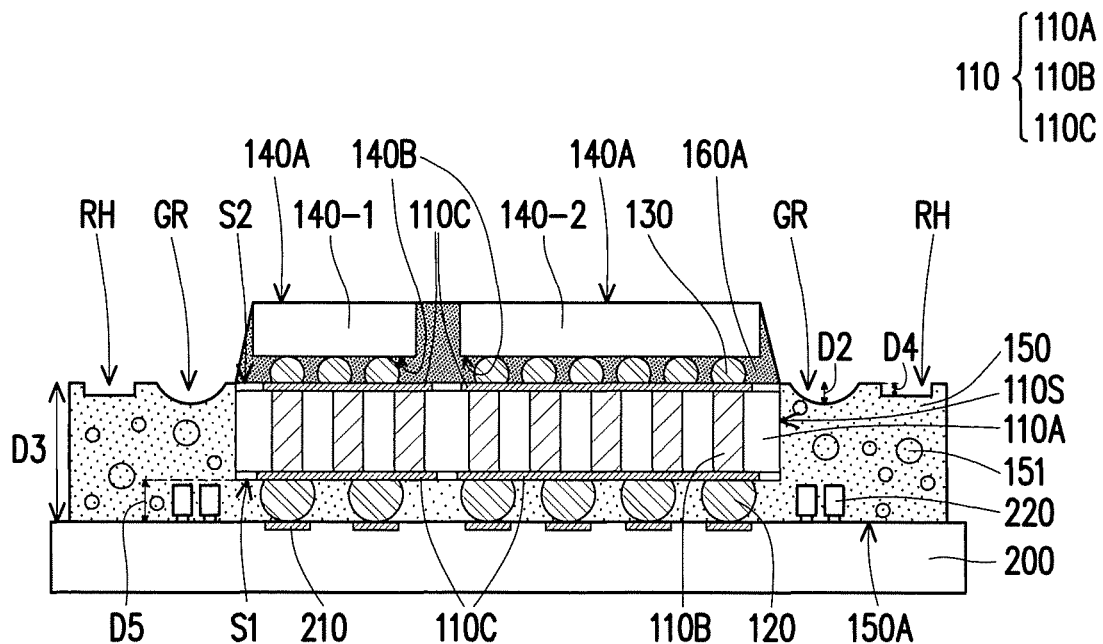

FIG. 11 is a schematic view of a semiconductor package 100G according to some other exemplary embodiments of the present disclosure. The embodiment shown in FIG. 11 is similar to the embodiment shown in FIG. 9, hence the same reference numerals are used to denote the same and like parts, and its detailed description will be omitted herein. The difference between the embodiment shown in FIG. 11 and the embodiment shown in FIG. 9 is that, in the semiconductor package 100G of FIG. 11, the insulating encapsulant 150' is coplanar/levelled with the second surface S2 of the interposer structure 110, or the second surface 150B of the insulating encapsulant 150 is coplanar/levelled with a surface (S2) of the interposer structure 110. That is, the height D3 of the insulating encapsulant 150' is reduced. In the illustrated embodiment, the insulating encapsulant 150' is encapsulating the interposer structure 110, while the plurality of dies (140-1 and 140-2), and the first underfill 160-A are exposed from the insulating encapsulant 150'. Furthermore, the depth D2 of the grooves is approximately half of a stand-off height D5 of the interposer structure 110.

Figure 12:
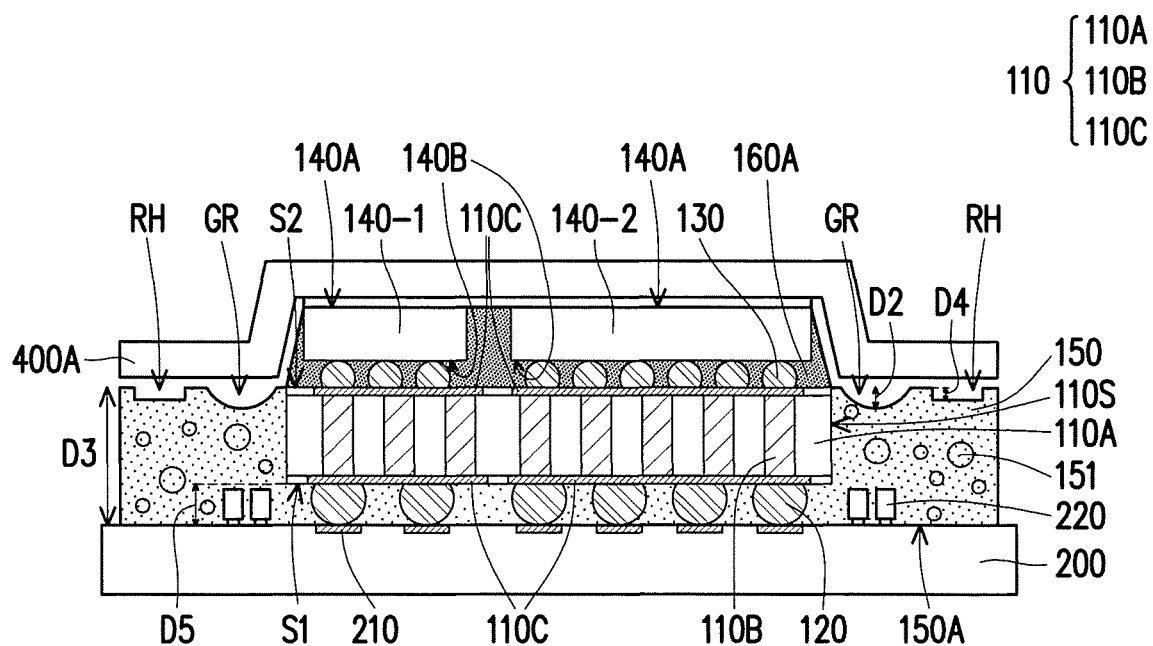

FIG. 12 is a schematic view of a semiconductor package 100H according to some other exemplary embodiments of the present disclosure. The embodiment shown in FIG. 12 is similar to the embodiment shown in FIG. 11, hence the same reference numerals are used to denote the same and like parts, and its detailed description will be omitted herein. The difference between the embodiment shown in FIG. 12 and the embodiment shown in FIG. 11 is that the semiconductor package 100H of FIG. 12 further contains a lid 400A. Similar to the lid 400 shown in FIG. 6, the lid 400A may be a heat sink used for heat dissipation. In the illustrated embodiment, the lid 400A conformally covers the insulating encapsulant 150' and the plurality of dies (140-1 and 140-2). Furthermore, the thickness of the lid 400A remains unchanged when covering different areas (higher/lower portions) of the semiconductor package 100H.

Figure 13:
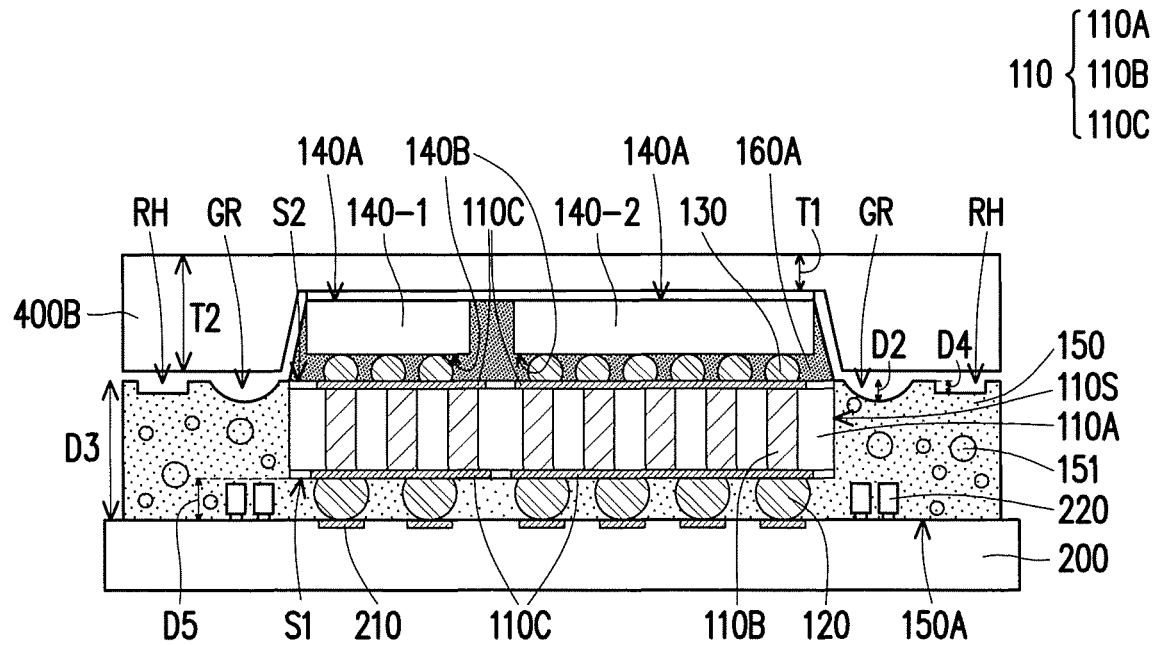

FIG. 13 is a schematic view of a semiconductor package 100I according to some other exemplary embodiments of the present disclosure. The embodiment shown in FIG. 13 is similar to the embodiment shown in FIG. 12, hence the same reference numerals are used to denote the same and like parts, and its detailed description will be omitted herein. The difference between the embodiment shown in FIG. 13 and the embodiment shown in FIG. 12 is in the design of the lids (400A/400B). Similar to the lid 400 shown in FIG. 6, the lid 400B may be a heat sink used for heat dissipation. As shown in FIG. 13, in some embodiments, the lid 400B may have a region with a first thickness T1 and another region with a second thickness T2. The second thickness T2 may for example be larger than the first thickness T1. In the illustrated embodiment, the region of the lid 400B with the first thickness T1 covers the plurality of dies (140-1 and 140-2), the interposer structure 150 and portions of the insulating encapsulant 150', whereas the other regions of the lid 400B with the second thickness T2 covers the groove GR and the remaining portions of the insulating encapsulant 150'.

Figure 14:
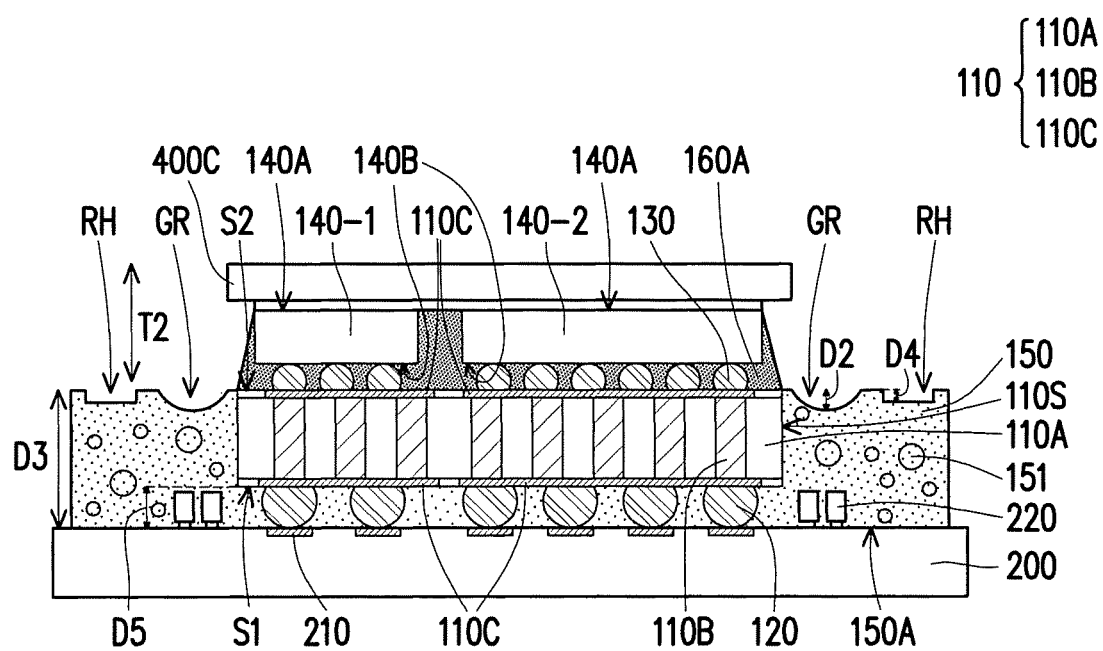

FIG. 14 is a schematic view of a semiconductor package 100J according to some other exemplary embodiments of the present disclosure. The embodiment shown in FIG. 14 is similar to the embodiment shown in FIG. 12, hence the same reference numerals are used to denote the same and like parts, and its detailed description will be omitted herein. The difference between the embodiment shown in FIG. 14 and the embodiment shown in FIG. 12 is in the design of the lids (400A/400C). Similar to the lid 400 shown in FIG. 6, the lid 400C may be a heat sink used for heat dissipation. As shown in FIG. 14, in some embodiments, the lid 400C may cover the plurality of dies (140-1 and 140-2) and the interposer structure 150, however, the groove GR and portions of the insulating encapsulant 150 are not covered by the lid 400C. Based on the embodiments shown in FIG. 12 to FIG. 14, it may be noted that the design of the lids may be adjusted based on thermal dissipation requirements.

In the above embodiments, since a groove is formed in the insulating encapsulant to surround the interposer structure and the plurality of dies, the package mechanical stress may be released for better reliability life, and the warpage of the package may be controlled. Furthermore, the insulating encapsulant can be used to replace underfills to fill the spaces in between the plurality of dies, the interposer structure and the circuit substrate, or alternatively, larger fillers may be used in the insulating encapsulant. As such, the product cost of the semiconductor package may be reduced effectively through the reduction in material usage and process flow steps.

In some embodiments of the present disclosure, a semiconductor package including a circuit substrate, an interposer structure, a plurality of dies, and an insulating encapsulant is provided. The interposer structure is disposed on the circuit substrate. The plurality of dies is disposed on the interposer structure, wherein the plurality of dies is electrically connected to the circuit substrate through the interposer structure. The insulating encapsulant is disposed on the circuit substrate, wherein the insulating encapsulant surrounds the plurality of dies and the interposer structure and encapsulates at least the interposer structure, and the insulating encapsulant has a groove that surrounds the interposer structure and the plurality of dies, and the interposer structure and the plurality of dies are confined to be located within the groove.

In some embodiments of the present disclosure, a semiconductor package including a circuit substrate, an interposer structure, first conductive bumps, at least one die, second conductive bumps and an insulating encapsulant is provided. The interposer structure is disposed on the circuit structure. The first conductive bumps are disposed in between the circuit substrate and the interposer structure, wherein the interposer structure is electrically connected to the circuit substrate through the first conductive bumps. The at least one die is disposed on the interposer structure. The second conductive bumps are disposed in between the interposer structure and the at least one die, wherein the at least one die is electrically connected to the interposer through the second conductive bumps. The insulating encapsulant is disposed around the interposer structure and the at least one die and encapsulating at least sidewalls of the interposer structure and the first conductive bumps, wherein the insulating encapsulant has a groove that surrounds the interposer structure and the at least one die, and the at least one die is partially exposed from a first surface of the insulating encapsulant.

In some embodiments of the present disclosure, a method of fabricating a semiconductor package is described. The method includes the following steps. An interposer structure is provided, the interposer structure has a first surface, and a second surface opposite to the first surface. A plurality of first conductive bumps is disposed on the first surface of the interposer structure. A plurality of second conductive bumps is disposed on the second surface of the interposer structure. A plurality of dies is disposed on the second surface of the interposer structure, wherein the plurality of dies is electrically connected to the interposer structure through the plurality of second conductive bumps. The interposer structure and the plurality of dies are disposed on a circuit substrate, wherein the interposer structure is electrically connected to the circuit substrate through the plurality of first conductive bumps. The insulating encapsulant is formed to encapsulate the interposer structure and the plurality of first conductive bumps, wherein the insulating encapsulant is formed with a groove that surrounds the interposer structure and the plurality of dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a circuit substrate;
   an interposer structure disposed on the circuit substrate;
   a plurality of dies disposed on the interposer structure, wherein the plurality of dies is electrically connected to the circuit substrate through the interposer structure; and
   an insulating encapsulant disposed on the circuit substrate, wherein the insulating encapsulant surrounds the plurality of dies and the interposer structure and encapsulates at least the interposer structure, the insulating encapsulant has a vacant groove that surrounds the interposer structure and the plurality of dies, and the interposer structure and the plurality of dies are confined to be located within an area surrounded by the vacant groove.

2. The semiconductor package according to claim 1, wherein the insulating encapsulant has a first surface contacting the circuit substrate and a second surface opposite to the first surface, and the vacant groove is located on the second surface.

3. The semiconductor package according to claim 2, wherein the insulating encapsulant further encapsulates the plurality of dies, and back surfaces of the plurality of dies are exposed through the insulating encapsulant, and the second surface of the insulating encapsulant is coplanar with the exposed back surfaces of the plurality of dies.

4. The semiconductor package according to claim 2, wherein the second surface of the insulating encapsulant is levelled with a surface of the interposer structure.

5. The semiconductor package according to claim 2, wherein the insulating encapsulant has at least one runner hole opening located on the second surface of the insulating encapsulant, and a depth of the vacant groove is greater than a depth of the at least one runner hole opening.

6. The semiconductor package according to claim 1, wherein relative to a sum D1 of a height of one of the plurality of dies and a height of the interposer structure, a depth D2 of the vacant groove is about half of the sum D1.

7. The semiconductor package according to claim 1, wherein a depth D2 of the vacant groove is about half of a height D3 of the insulating encapsulant.

8. The semiconductor package according to claim 1, further comprising:
   first conductive bumps disposed between the plurality of dies and the interposer structure; and
   a first underfill, filling in between the first conductive bumps and between the plurality of dies and the interposer structure.

9. The semiconductor package according to claim 8, further comprising:
   second conductive bumps disposed between the interposer structure and the circuit substrate; and
   a second underfill, filling in between the second conductive bumps and between the interposer structure and the circuit substrate, wherein the first underfill and the second underfill are encapsulated by the insulating encapsulant.

10. The semiconductor package according to claim 1, further comprising a lid disposed on the plurality of dies and covering the plurality of dies.

11. The semiconductor package according to claim 10, wherein the lid conformally covers the insulating encapsulant and the plurality of dies.

12. A semiconductor package, comprising:
   a circuit substrate;
   an interposer structure disposed on the circuit substrate;
   first conductive bumps disposed in between the circuit substrate and the interposer structure, wherein the interposer structure is electrically connected to the circuit substrate through the first conductive bumps;
   at least one die disposed on the interposer structure;
   second conductive bumps disposed in between the interposer structure and the at least one die, wherein the at least one die is electrically connected to the interposer structure through the second conductive bumps; and
   an insulating encapsulant, disposed around the interposer structure and the at least one die and encapsulating at least sidewalls of the interposer structure and the first conductive bumps, wherein the insulating encapsulant has a ring shape groove that surrounds the interposer structure and the at least one die, the ring shape groove is separated from the interposer structure and the at least one die by a distance, and the at least one die is partially exposed from a first surface of the insulating encapsulant.

13. The semiconductor package according to claim 12, wherein the insulating encapsulant has a second surface opposite to the first surface, the second surface is in contact with the circuit substrate, and the ring shape groove is located on the first surface.

14. The semiconductor package according to claim 13, wherein the insulating encapsulant further encapsulates the at least one die, and the first surface of the insulating encapsulant is coplanar with the exposed surfaces of the at least one die.

15. The semiconductor package according to claim 13, wherein the first surface of the insulating encapsulant is levelled with a surface of the interposer structure.

16. The semiconductor package according to claim 13, wherein the insulating encapsulant has at least one runner hole opening located on the first surface of the insulating encapsulant, and a depth of the ring shape groove is greater than a depth of the at least one runner hole opening.

17. The semiconductor package according to claim 12, wherein a depth of the ring shape groove is more than half of a stand-off height of the interposer structure, and less than half of a sum of heights of the at least one die and the interposer structure.

18. The semiconductor package according to claim 12, further comprising:
   a first underfill, filling spaces in between the at least one die, the second conductive bumps and the interposer structure.

19. A method of fabricating a semiconductor package, comprising:
   providing an interposer structure, the interposer structure has a first surface, and a second surface opposite to the first surface;
   disposing a plurality of first conductive bumps on the first surface of the interposer structure;
   disposing a plurality of second conductive bumps on the second surface of the interposer structure;
   disposing a plurality of dies on the second surface of the interposer structure, wherein the plurality of dies is electrically connected to the interposer structure through the plurality of second conductive bumps;
   disposing the interposer structure and the plurality of dies on a circuit substrate, wherein the interposer structure is electrically connected to the circuit substrate through the plurality of first conductive bumps; and
   forming an insulating encapsulant encapsulating the interposer structure and the plurality of first conductive bumps, wherein the insulating encapsulant is formed with a vacant groove that surrounds the interposer structure and the plurality of dies, and the interposer structure and the plurality of dies are confined to be located within an area surrounded by the vacant groove.

20. The method according to claim 19, wherein the method of forming the insulating encapsulant comprises:
   providing a mold on the circuit substrate covering the interposer structure and the plurality of dies, wherein the mold comprises runner holes and a release film attached to an inner surface of the mold;
   injecting an insulating material into the mold through the runner holes so that the insulating material encapsulates at least the interposer structure;
   curing the insulating material to form the insulating encapsulant; and
   removing the mold and separating the insulating encapsulant from the mold.

* * * * *